(12) United States Patent
Lee et al.

(10) Patent No.: US 9,281,494 B2
(45) Date of Patent: Mar. 8, 2016

(54) DISPLAY DEVICE AND ORGANIC LIGHT EMITTING DIODE DISPLAY

(75) Inventors: Choong-Ho Lee, Yongin (KR); Kie Hyun Nam, Yongin (KR); Jung-Min Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 306 days.

(21) Appl. No.: 13/064,721

(22) Filed: Apr. 11, 2011

(65) Prior Publication Data

US 2012/0026074 A1    Feb. 2, 2012

(30) Foreign Application Priority Data

Jul. 29, 2010    (KR) .......................... 10-2010-0073513

(51) Int. Cl.
*H01L 51/52*    (2006.01)
*H01L 27/32*    (2006.01)

(52) U.S. Cl.
CPC ........ *H01L 51/5237* (2013.01); *H01L 27/3276* (2013.01); *H01L 51/5246* (2013.01)

(58) Field of Classification Search
CPC ............ H01L 27/3276; H01L 51/5237; H01L 51/5246
USPC ............ 345/76, 173–183; 313/495, 503, 504, 313/506, 511, 512
See application file for complete search history.

(56) References Cited

U.S. PATENT DOCUMENTS

| 6,998,776 | B2 | 2/2006 | Aitken et al. | |
|---|---|---|---|---|
| 7,537,504 | B2 | 5/2009 | Becken et al. | |
| 7,538,488 | B2* | 5/2009 | Kwak | 313/506 |
| 2002/0125484 | A1 | 9/2002 | Silvernail et al. | |
| 2003/0168966 | A1* | 9/2003 | Kobayashi et al. | 313/495 |
| 2004/0232833 | A1* | 11/2004 | Menda et al. | 313/512 |
| 2005/0036090 | A1* | 2/2005 | Hayashi et al. | 349/122 |
| 2008/0242787 | A1* | 10/2008 | Kim et al. | 524/450 |
| 2008/0303140 | A1 | 12/2008 | Ohtani et al. | |
| 2009/0065590 | A1* | 3/2009 | Aoki et al. | 235/492 |
| 2009/0108738 | A1* | 4/2009 | Kwak | 313/504 |
| 2009/0224663 | A1* | 9/2009 | Inoue et al. | 313/504 |
| 2010/0013372 | A1 | 1/2010 | Oikawa et al. | |

FOREIGN PATENT DOCUMENTS

| CN | 1496543 A | 5/2004 |
|---|---|---|
| CN | 1575048 A | 2/2005 |
| EP | 1 835 333 B1 | 2/2009 |
| JP | 10-091095 | 4/1998 |
| JP | 2001-052858 | 2/2001 |
| JP | 2001-133761 | 5/2001 |
| JP | 2005-338419 | 12/2005 |
| JP | 2008-186618 | 8/2008 |
| KR | 10-2003-0083528 A | 10/2003 |
| KR | 10-2006-0065367 A | 6/2006 |
| KR | 10-2007-0033702 A | 3/2007 |
| KR | 10-2008-0088031 A | 10/2008 |

* cited by examiner

*Primary Examiner* — Kumar Patel
*Assistant Examiner* — Insa Sadio
(74) *Attorney, Agent, or Firm* — Lee & Morse, P.C.

(57) ABSTRACT

A display device includes: a display substrate; a display unit formed on the display substrate and a sealing substrate affixed to the display substrate by an adhering layer that surrounds the display unit. The sealing substrate includes a composite member including a resin and a plurality of carbon fibers and an insulating member attached to the composite member. The insulating member includes a through hole. A metal film is disposed at one side of the sealing substrate, facing the display substrate; and a conductive connection portion contact the metal film through the through hole.

29 Claims, 18 Drawing Sheets

700

DISPLAY DEVICE AND ORGANIC LIGHT EMITTING DIODE DISPLAY

BACKGROUND

1. Field

The described technology relates generally to a display device. More particularly, the described technology relates generally to an organic light emitting diode (OLED) display. In addition, the described technology relates generally to a sealing substrate that seals a display unit.

2. Description of the Related Art

A display device includes a self-emissive organic light emitting diode (OLED) display formed in a plate shape. The OLED display is provided with an organic light emitting element that emits light to display an image.

The above information disclosed in this Background section is only for enhancement of understanding of the background of the described technology and therefore it may contain information that does not form the prior art that is already known in this country to a person of ordinary skill in the art.

SUMMARY

According to an embodiment, there is provided a display device including: a display substrate, a display unit disposed on the display substrate, a sealing substrate affixed to the display substrate by an adhering layer that surrounds the display unit, the sealing substrate including a composite member including a resin and a plurality of carbon fibers and an insulating member affixed to the composite member, the insulating member including at least one through hole, a metal film disposed at one side of the sealing substrate, facing the display substrate, and a conductive connection portion contacting the metal film through at least one through hole.

The carbon fibers may cross each other in the resin.

The composite member may include a plurality of layers, each of the plurality of layers including a resin and a plurality of carbon fibers, wherein a plurality of carbon fibers arranged in at least one of the plurality of layers and a plurality of carbon fibers arranged in at least another layer among the plurality of layers cross each other.

The insulating member may be affixed to the composite member at a peripherally outward side of at least three peripheral edges of the composite member. The at least one through hole may include a plurality of first through holes through the insulating member. The composite member may include a plurality of second through holes.

The display device may further include a first conductive portion extending between inner and outer sides of the insulating member through the plurality of first through holes and receiving a first electric signal, and a second conductive portion extending between inner and outer sides of the composite member through the plurality of second through holes and receiving a second electric signal.

The insulating member may be affixed to the composite member at a peripherally outward side of all peripheral edges of the composite member. The at least one through hole may include a plurality of first through holes and a plurality of second through holes.

The display device may further include a first conductive portion extending between inner and outer sides of the insulating member through the plurality of first through holes and receiving a first electric signal, and a second conductive portion extending between an inner side of the insulating member, an inner side of the composite member, and an outer side of the insulating member through the plurality of second through holes and receiving a second electric signal.

The composite member may include a protrusion at a side surface that faces the insulating member, and the insulating member may include a groove receiving the protrusion.

The composite member may include a plurality of protruding portions spaced apart from each other at a side surface facing the insulating member, and the insulating member may include a plurality of recess portions receiving the protruding portions.

The insulating member further may include an insulating plate covering an external surface of the composite member.

The insulating member further may include a protection portion that protectively covers the adhering layer and a side surface of the display substrate.

The insulating member may be a plastic injection molded material.

The insulating member may include a negative thermal expansion filler.

The metal film may include at least one of an aluminum film, an aluminum alloy film, a copper film, and a copper alloy film.

According to an embodiment, there is provided an organic light emitting diode (OLED) display including a display substrate, a display unit disposed on the display substrate and including a common power line and a common electrode, a sealing substrate affixed to the display substrate by at least one adhering layer that surrounds the display unit, the sealing substrate including first and second through holes, a first conductive portion disposed on inner and outer sides of the sealing substrate and extending through the first through holes, the first conductive portion supplying a first electric signal to the common power line, and a second conductive portion disposed on the inner and outer sides of the sealing substrate and extending through the second through holes, the second conductive portion supplying a second electric signal to the common electrode, wherein the sealing substrate includes, a composite member including a resin and a plurality of carbon fibers, and an insulating member attached to the composite member and including at least one through hole among the first and second through holes.

The OLED display may further include a pad unit disposed peripherally outward from the display unit, and including a first pad connected with the common power line and a second pad connected with the common electrode, and a conductive adhering layer disposed between the first pad and the first conductive portion and between the second pad and the second conductive portion.

The common power line may include a first common power line and a second common power line that cross each other, and wherein the pad unit includes a plurality of the first pad and the second pad iteratively alternated along one direction of the display substrate.

The conductive adhering layer may be electrically conductive in the thickness direction and electrically insulating in directions other than the thickness direction.

The OLED display may further include a first pad disposed at an outer side of the display unit and a conductive adhering layer disposed between the first pad and the first conductive portion. The second conductive portion may be directly attached to the common electrode.

The OLED display may further include a plurality of spacers disposed at a lower portion of the common electrode. The common electrode may include protruding portions corresponding to the spacers and contacting the second conductive portion.

The insulating member may be attached to the composite member at peripherally outward sides of at least three peripheral edges of the composite member, and wherein the insulating member includes the plurality of first through holes, and the composite member includes the plurality of second through holes.

The first conductive portion may include a first inner layer disposed at the inner side of the insulating member, a first connection portion extending through the first through hole, and a first outer layer disposed at the outer side of the insulating member. The second conductive portion may include a second inner layer formed at the inner side of the composite member, a second connection portion filled in the second through hole, and a second outer layer formed at the outer side of the composite member.

The insulating member may be attached to the composite member at a peripherally outward side of the edges of the composite member. The insulating member may include the first and second through holes.

The first conductive portion may include a first inner layer at the inner side of the insulating member, a first connection portion that fills the first through hole, and a first outer layer at the outer side of the insulating member. The second conductive portion may include a second inner layer at the inner side of the insulating member and the inner side of the composite member, a second connection portion that fills the second through hole, and a second outer layer at the outer side of the insulating member.

The second inner layer may include a metal foil having an oxide film formed by anodizing at one side thereof, facing the composite member.

The insulating member may be made of a plastic injection molded material.

The insulating member may include a negative thermal expansion filler.

The composite member may include a protrusion at a side surface thereof, facing the insulating member. The insulating member may include a groove that receives the protrusion.

The composite member may include a plurality of protruding portions spaced apart from each other at a side surface, facing the insulating member and the insulating member may include recess portions receiving the protruding portions.

The insulating member may further include an insulating plate covering an external surface of the composite member.

The insulating member may further include a protection portion covering the adhering layer and the display substrate.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
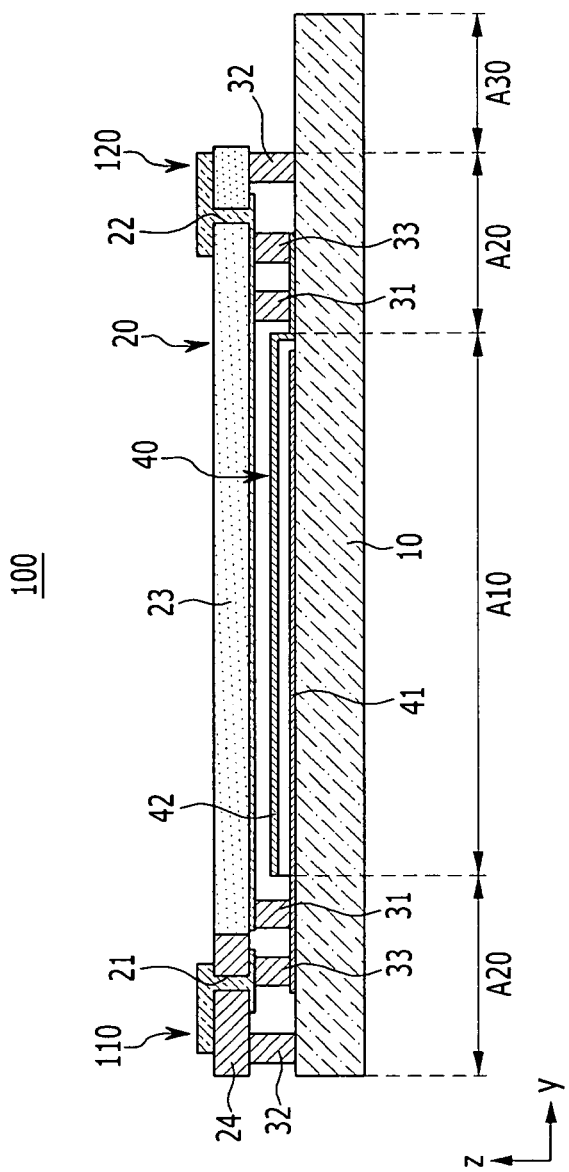
FIG. 1 illustrates a schematic cross-sectional view of an organic light emitting diode (OLED) display according to an exemplary embodiment.

Korean Patent Application No. 10-2010-0073513, filed on Jul. 29, 2010, in the Korean Intellectual Property Office, and entitled: "Display Device and Organic Light Emitting Diode Display," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will also be understood that when a layer is referred to as being "between" two layers, it can be the only layer between the two layers, or one or more intervening layers may also be present. Like reference numerals refer to like elements throughout.

Herein, unless otherwise specified, terms such as "conductive" and "insulating" refer to electrical conductivity and insulation.

Herein, unless otherwise specified, the terms "inner" and "outer" refer to respective directions toward or away from a center of a described display and perpendicular to a plane of the described display (for example, in the direction of the Z-axis shown in FIGS. 1, 10, 13-14 and 16-17). The terms "peripherally inward" and "peripherally outward" refer to respective directions toward or away from a center of a described display in a plane of the described display (for example, in the plane defined by the X-Y-axes shown in FIGS. 2-4, 11, 12, and 15).

FIG. 1 illustrates a schematic cross-sectional view of an organic light emitting diode (OLED) display according to a first exemplary embodiment.

Referring to FIG. 1, an OLED display 100 according to the first exemplary embodiment includes a substrate 10, a display unit 40 formed in the substrate 10, and a sealing substrate 20 fixed to the substrate 10 by adhering layers 31 and 32 surrounding the display unit 40. The substrate 10 includes a display area A10, where the display unit 40 is located, and a non-display area peripherally outward from the display area A10. The non-display area may be divided into wires, a sealing area A20, and a pad area A30.

Figure 5:
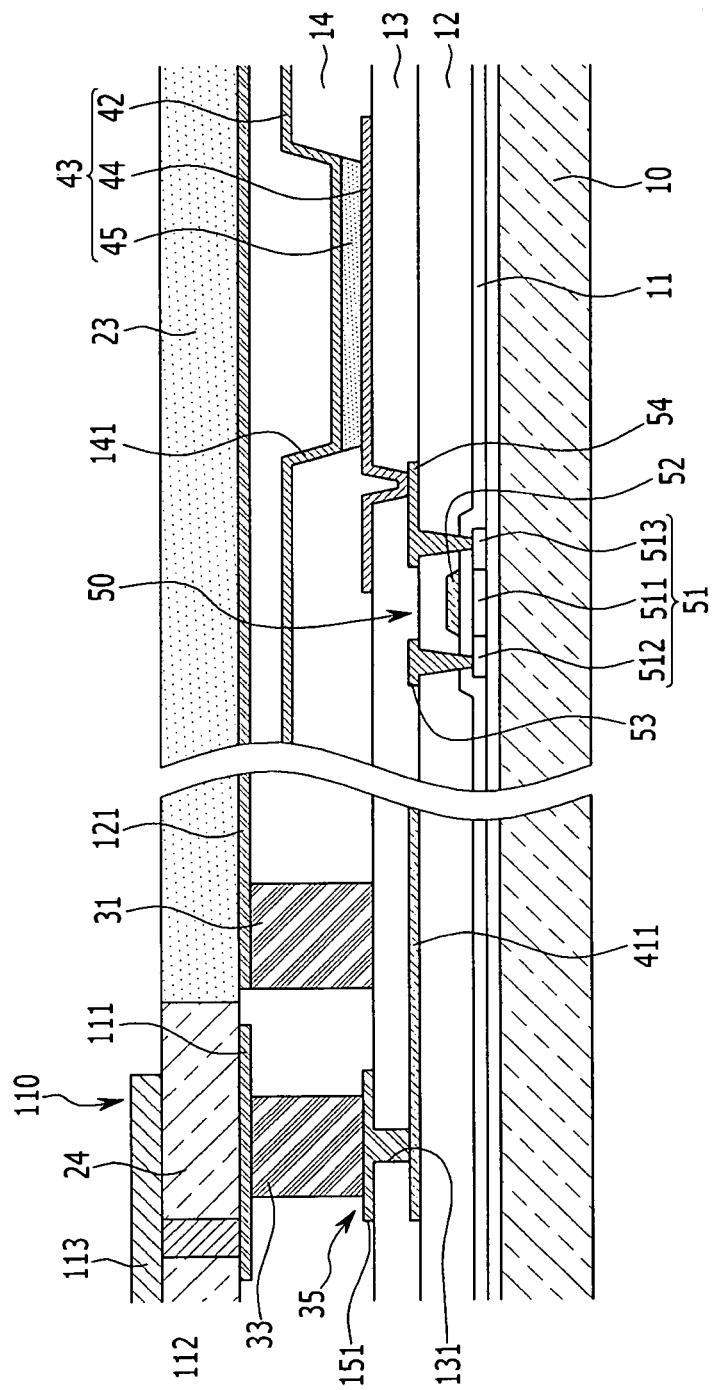
FIG. 5 to FIG. 7 illustrate partially enlarged cross-sectional views of the OLED display according to the exemplary embodiment of FIG. 1.
Figure 6:
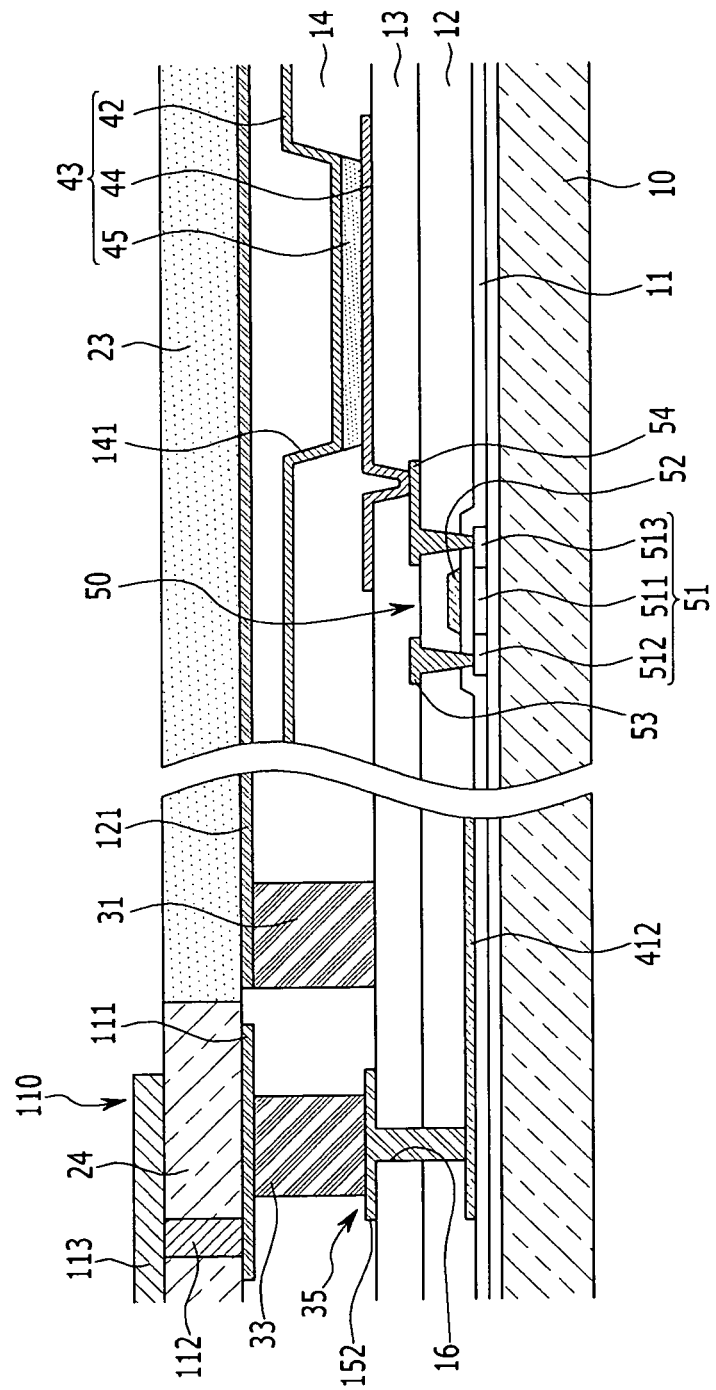
Figure 7:
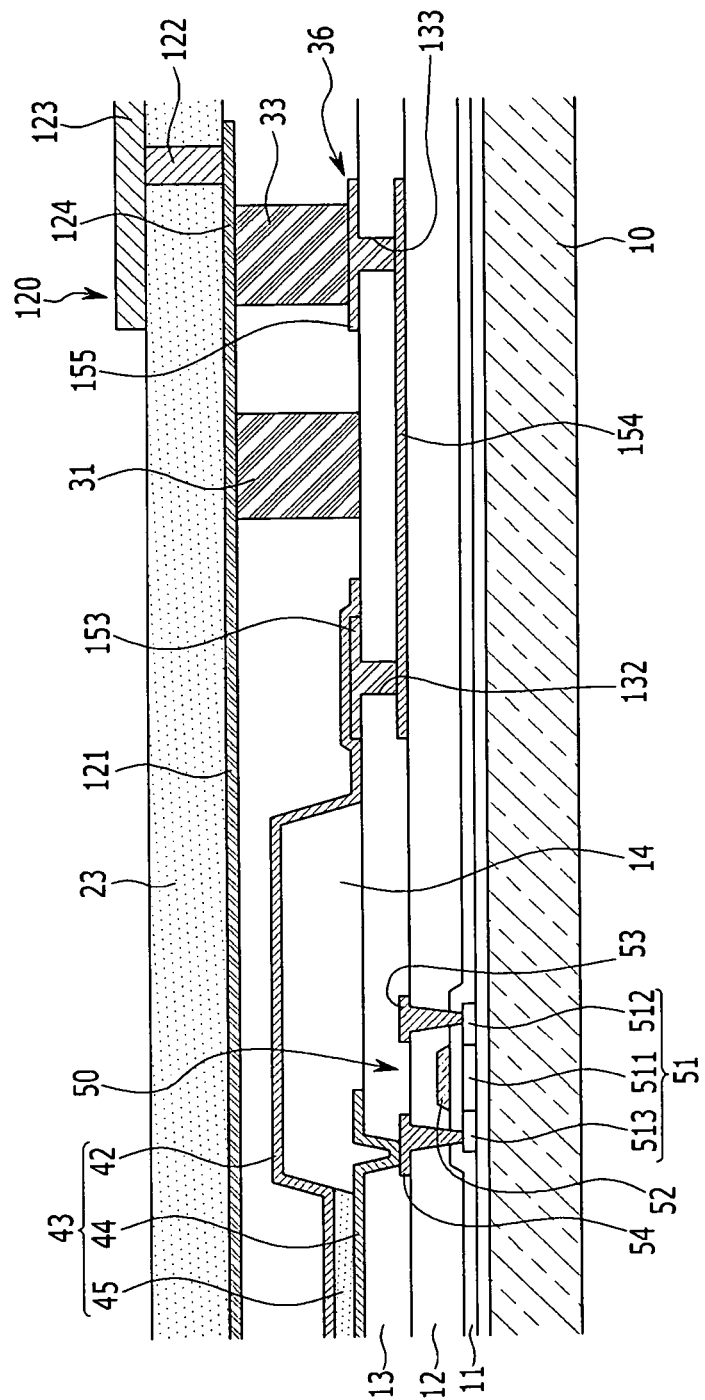

The display unit 40 includes a plurality of pixels, and an organic light emitting element 43 and a driving circuit are formed in each pixel (see, for example, FIGS. 5 to 7). The organic light emitting element 43 includes a pixel electrode 44, an organic emission layer 45, and a common electrode 42. The driving circuit is formed of at least two thin film transistors including a switching thin film transistor and a driving thin film transistor 51, and at least one capacitor.

In addition, gate lines, data lines, and common power lines 41 are arranged in each pixel. The gate line transmits a scan signal and the data line transmits a data signal. The common power line 41 applies a common voltage to the driving thin film transistor 51. The common power line 41 may be parallel with the data line, or may be formed of a first common power line that is parallel with the data line and a second common power line that is parallel with the gate line.

A detailed description of the display unit 40 will be described below. FIG. 1 schematically illustrates the display unit 40 where the common power line 41 and the common electrode 42 are formed.

The adhering layers 31, 32 include a first adhering layer 31 surrounding the display unit 40 and a second adhering layer 32 located externally or peripherally outward from the first adhering layer 31. In addition, a conductive adhering layer 33 may be disposed between the first adhering layer 31 and the second adhering layer 32. The first adhering layer 31 and the second adhering layer 32 may be non-conductive, and may include an inorganic material, such as a glass frit, and a resin. The resin may include a thermosetting resin, such as, for example, an epoxy resin, polyurethane resin, phenol resin, melamine resin, and unsaturated polyester resin. Meanwhile, the material of the first adhering layer 31 and the second adhering layer is not limited thereto, so far as the material can seal or affix the substrate 10 and the sealing substrate 20. In addition, a moisture absorbing filler (not shown) may be formed between the substrate 10 and the sealing substrate 20 at a location peripherally inward from the first adhering layer 31.

In the above-stated OLED display 100, the common power line 41 and the common electrode 42 are not connected with a flexible printed circuit (not shown) attached to the pad area A30. The common power line 41 is connected with a first conductive portion 110 formed in the sealing substrate 20 and receives a first electric signal therefrom, and the common electrode 42 is connected with a second conductive portion 120 formed in the sealing substrate 20 and receives a second electric signal therefrom.

Thus, the OLED display 100 can evenly apply the corresponding electric signal to the common power line 41 and the common electrode 42 without forming the pad areas A30 at four edges (up, down, right, and left) of the substrate 10, while providing a large-sized display unit 40. As a result, the entire structure and the manufacturing process of the OLED display 100 can be simplified while providing a large-sized display unit 40 in which luminance non-uniformity may be prevented.

Figure 2:
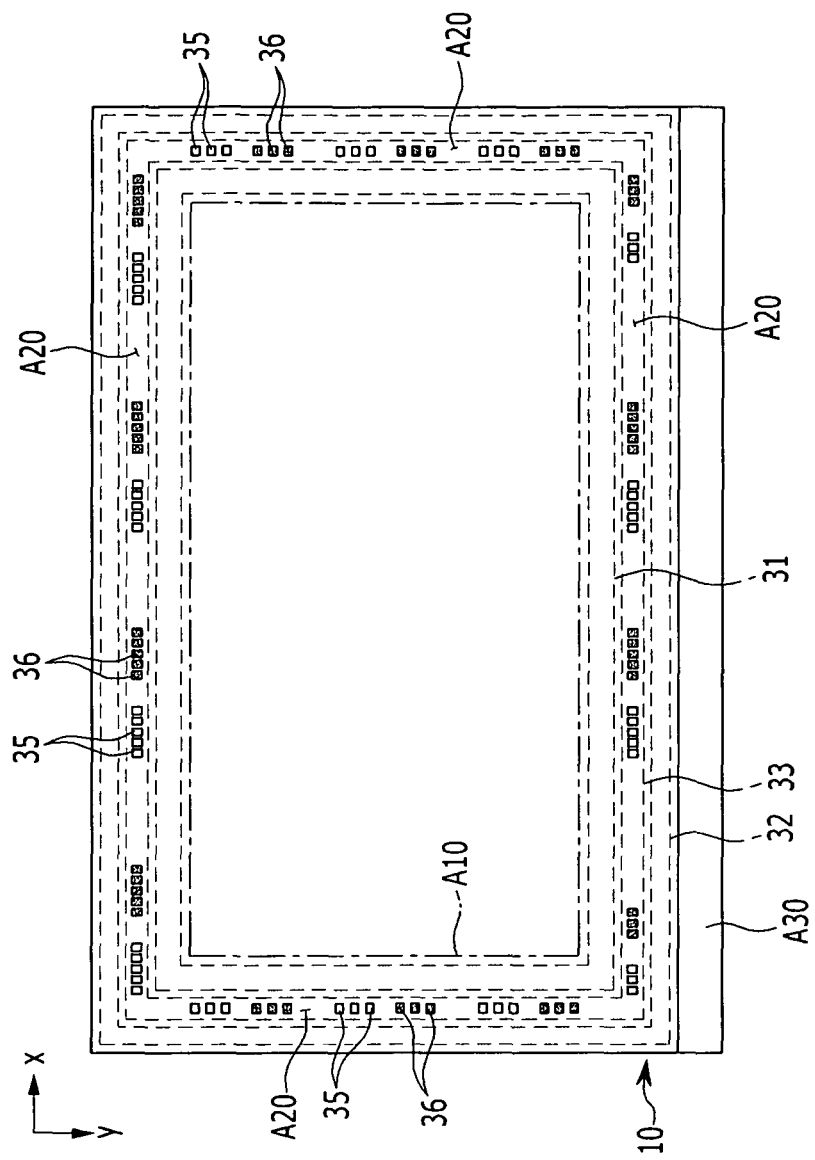
FIG. 2 illustrates a top plan view of a substrate of the OLED display of FIG. 1.

FIG. 2 illustrates a top plan view of a substrate of the OLED display of FIG. 1.

Referring to FIG. 1 and FIG. 2, a substrate 10 may be rectangular shaped with a pair of long sides and a pair of short sides. The wires and sealing areas A20 may be located peripherally outward from the four edges of the display area A10. In the wires and the sealing area A20, the first adhering layer 31, the conductive adhering layer 33, and the second adhering layer 32 may be located.

In addition, the pad area A30 may be located at one of the edges of the substrate 10 peripherally outward from the wires and the sealing area A20. Although FIG. 2 illustrates that the pad area A30 is located at the lower long side of the substrate 10, the location of the pad area A30 is not limited thereto.

A first pad 35 electrically connected with the common power line 41 of the display unit 40 and a second pad 36 electrically connected with the common electrode 42 of the display unit 40 may be located in the wires and sealing area A20. A plurality of first pads 35 and second pads 36 may be formed at the four wires and sealing areas A20, and the first pads 35 and the second pads 36 may be iteratively alternated along a horizontal direction (x-axis direction in the drawing) and a vertical direction (y-axis direction in the drawing) of the substrate 10.

In FIG. 2, the second pad 36 is illustrated with a dot pattern and the first pad 35 is illustrated without a dot pattern in order to distinguish between the first pad 35 and the second pad 36. Among the plurality of first pads 35, first pads 35 that are located at the long side of the substrate 10 may be electrically connected with the first common power line, and first pads 35 located at the short side of the substrate 10 may be electrically connected with the second common power line. However, FIG. 2 exemplarily shows the locations and the number of first and second pads 35 and 36, and the illustrated locations and numbers are not restrictive.

The first pad 35 and the second pad 36 are formed at locations corresponding to the conductive adhering layer 33 in the wire and sealing area A20. The conductive adhering layer 33 may be provided to be conductive only in the thickness direction (z-axis direction of the drawing) and non-conductive in directions other than the thickness direction. Accordingly, a short circuit between the first pad 35 and the second pad 36 may be avoided even though one conductive adhering layer 33 contacts both the first pad 35 and the second pad 36.

A conductive adhering layer 33 having conductivity in all directions may be used. In this case, the conductive adhering layer 33 may be divided into a first conductive adhering layer (not shown) located corresponding to the first pad and a second conductive adhering layer (not shown) located corresponding to the second pad. In this case, the first conductive adhering layer and the second conductive adhering layer may be separated from each other with a predetermined distance in order to prevent short-circuit therebetween.

Figure 3:
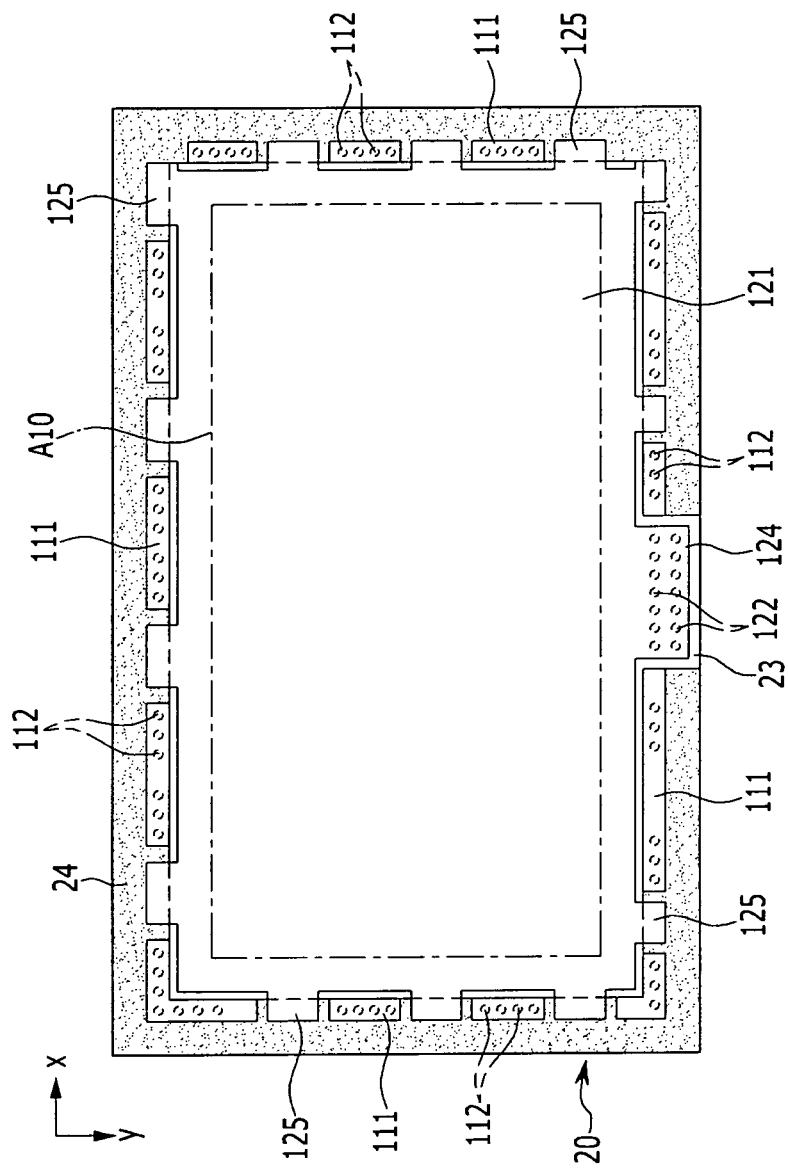
FIG. 3 illustrates a top plan view of a sealing substrate of the OLED display of FIG. 1.
Figure 4:
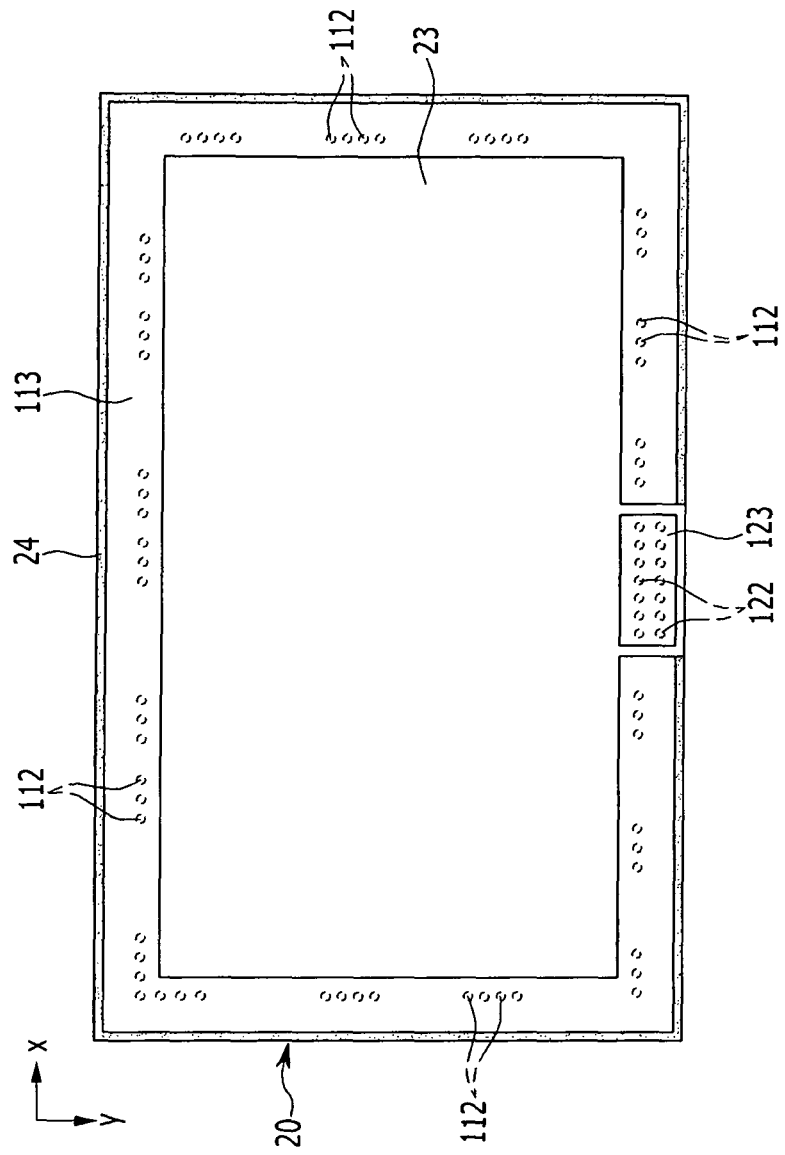
FIG. 4 illustrates a top plan view of an external surface of the sealing substrate of the OLED display of FIG. 1.

FIG. 3 and FIG. 4 illustrate top plan views of inner and outer surfaces of the sealing substrate in the OLED display of FIG. 1.

Referring to FIG. 1 to FIG. 4, the sealing substrate 20 may be formed in a size that covers the display area A10 and the four wires and sealing areas A20. Thus, the pad area A30 of the substrate 10 may be exposed to the outside without being overlapped with the sealing substrate 20.

The sealing substrate 20 may include a first through hole 21 through which a first electric signal of the common power line 41 may be applied and a second through hole 22 through which a second electric signal of the common electrode 42 may be applied. In addition, a first conductive portion 110 may extend over the inner surface of the sealing substrate 20, through the first through hole 21, and over the outer surface of the sealing substrate 20. A second conductive portion 120 may extend over the inner surface of the sealing substrate 20, through the second through hole 22, and over the outer surface of the sealing substrate 20.

The sealing substrate 20 may be formed of a composite member 23 and an insulating member 24 affixed to the external side of the composite member 23. The composite member 23 may include a resin and a plurality of carbon fibers. The first through hole 21 and the first conductive portion 110 may be formed in the insulating member 24, and the second through hole 22 and the second conductive portion 120 may be formed in the composite member 23.

The composite member 23 may be formed to contact the first adhering layer 31 while entirely facing the display unit 40. The insulating member 24 may be affixed to at least three peripherally outward sides of the composite member 23 and may partially face the wires and sealing areas A20. The insulating member 24 may be equivalent to the composite member 23 in thickness, and may be manufactured through injection molding using plastic.

FIG. 3 and FIG. 4 exemplarily illustrate that the insulating member 24 may contact the entire edges of the composite member 23, excluding a part of an edge at one long side thereof. However, the shape of the insulating member 24 is not limited to the exemplary drawing, and the shape may be variously modified.

The substrate 10 of the OLED display 100 may be formed with glass or a polymer resin having a small thermal expansion coefficient, since the substrate 10 may experience the thermal treatment processes several times during the forming of the driving circuit and the organic light emitting element thereon. The composite member 23 may be provided to have a thermal expansion coefficient that is similar to that of the substrate 10 by controlling the content of the carbon fiber and the content of the resin.

Thus, when the substrate 10 and the sealing substrate 20 are sealed to each other by hardening the first and the second adhering layer 31 and 32 and the conductive adhering layer 33 at high temperature, torsion of the two substrates 10 and 20 due to the thermal expansion coefficient difference therebetween may be avoided, and a bending problem may be avoided in the environment reliability test after the sealing.

The composite member 23 may have conductivity due to the presence of the carbon fiber. If the sealing substrate 20 were to be formed of only the composite member 23 and the first and second conductive portions 110 and 120 were to be directly formed at the surface of the composite member 23, the first conductive portion 110 and the second conductive portion 120 might be short-circuited by the composite member 23. Thus, additional insulating processes such as forming an insulating film at the surface of the composite member 23 and side walls of the first and second through holes 21 and 22 could be required before forming the first and second conductive portions 110 and 120 on the composite member 23.

However, in the OLED display of the first exemplary embodiment, the sealing substrate 20 is divided into the composite member 23 and the insulating member 24 and the first through hole 21, and the first conductive portion 110 are formed in the insulating member 24 so that the first conductive portion 110 and the second conductive portion 120 can be insulated from each other without forming an additional insulator such as an insulating film. The detailed structure and constituent material of composite member 23 will be described below in detailed.

Referring to FIG. 5, the first conductive portion 110 may include a first inner layer 111 formed in the inner surface of the insulating member 24, a first connection portion 112 that extends through or fills the first through hole 21 while contacting the first inner layer 111, and a first outer layer 113 formed at the outer side of the insulating member 24 while contacting the first connection portion 112.

Referring to FIG. 7, the second conductive portion 120 may include a second inner layer 121 formed at the inner surface of the composite member 23, a second connection portion 122 that extends through or fills the second through hole 22 while contacting the second inner layer 121, and a second outer layer 123 formed at the outer surface of the composite member 23 while contacting the second connection portion 122.

The second conductive portion 120 may be directly formed on the composite member 23 so that the composite member 23 and the second conductive portion 120 are conductive to each other. The insulating member 24 may be insulated from the composite member 23 so that the first conductive portion 110 formed on the insulating member 24 is not short-circuited with the second conductive portion 120. The first through hole 21 and the second through hole 22 may be formed at a location facing the wires and the sealing areas A20 of the substrate 10.

The second inner layer 121 may be formed in a size that covers the display unit 40 and contacts the first adhering layer 31. The second inner layer 121 may be formed of a metal film having low resistance and an excellent moisture and oxygen interception effect, such as an aluminum film, an aluminum alloy film, a copper film, or a copper alloy film. In addition, the second inner layer 121 may be formed with a metal foil including aluminum or copper.

The second inner layer 121 may be attached to the first adhering layer 31 to cover the display unit 40 peripherally inward from the first adhering layer 31 for protection. The second inner layer may intercept moisture and oxygen entering from the outside to the display unit 40. The external moisture and oxygen may intercepted by the composite member 23 having a dense structure and then intercepted by the second inner layer 121. Thus, the composite member 23 provided with the second inner layer 121 may provide airtightness comparable to a glass substrate.

The second inner layer 121 may include a first extension portion 124 toward the edge of the composite member 23 to be in contact with the second connection portions 122, and may include a plurality of second extension portions 125 (FIG. 3) at the inner side of the insulating member 24 so as to face the second pad 36 of the substrate 10 such that the second inner layer 121 contacts the conductive adhering layer 33. Thus, the second pad 36 of the substrate 10 may be electrically connected with the second inner layer 121 through the conductive adhering layer 33 and the second extension portion 125.

The first inner layer 111 may be formed to contact the conductive adhering layer 33 between the second extension portions 125 of the second inner layer 121. The first inner layer 111 may be formed in plural, for example, as plural segments isolated for each other, each overlapping one or more of the first pads 35, interposing the conductive adhering layer 33 therebetween. Thus, the first pad 35 of the substrate 10 is electrically connected with the first inner layer 111 through the conductive adhering layer 33. The first inner layer 111 may be formed with a material that is the same as that of the second inner layer 121.

The first outer layer 113 may overlap all of the plurality of first inner layers 111 at the outer side of the insulating member 24, and the second outer layer 123 may be formed at the edge of the long side of the composite member 23 where the second through hole 22 is formed. The first outer layer 113 may be formed at the entire edge of the insulating member 24.

An external access terminal (not shown) may be attached to the first outer layer 113 and the second outer layer 123. Thus, the first outer layer 113 may receive the first electric signal of the first common power line 41 from the external access terminal and transmit the signal to the first inner layer 111, and the second outer layer 123 may receive the second electric signal of the common electrode 42 from the external access terminal and transmit the signal to the second inner layer 121.

At least one of the width and thickness of the first outer layer 113 may be greater than that of the first inner layer 111, and the second outer layer 123 may be thicker than the second inner layer 121. The first inner layer 111 and the second inner layer 121 may have the same thickness and the first outer layer 113 and the second outer layer 123 may have the same thickness to thereby prevent occurrence of stepped portions during the sealing process of the substrate 10 and the sealing substrate 20. The above-described structure may be usefully applied to a large-sized OLED display having large current capacity.

FIG. 5 to FIG. 7 illustrate partially enlarged cross-sectional views of the OLED display according to the first exemplary embodiment. FIG. 5 illustrates the first common power line and the first pad in detail, and FIG. 6 illustrates the second common power line and the first pad in detail. In addition, FIG. 7 illustrates the common electrode and the second pad in detail.

Referring to FIG. 5 to FIG. 7, an organic light emitting element 43 and a driving circuit may be formed in each pixel of the display unit 40. The driving circuit may be formed of at least two thin film transistors and at least one capacitor. In FIG. 5 to FIG. 7, one thin film transistor 50 and one organic light emitting element 43 may be formed in the display unit 40.

The thin film transistor 50 may include a semiconductor layer 51, a gate electrode 52, a source electrode 53, and a drain electrode 54. The semiconductor layer 51 may be formed as a polycrystalline silicon film, and may include a channel area 511, a source area 512, and a drain area 513. The channel area 511 may be an intrinsic semiconductor not doped with an impurity, and the source area 512 and the drain area 513 may be impurity-doped semiconductors.

The gate electrode 52 may be disposed on the channel area 511 of the semiconductor layer 51, interposing the gate insulating layer 11 therebetween. The source electrode 53 and the drain electrode 54 may be disposed on the gate electrode 52, interposing an interlayer insulating layer 12 therebetween, and respectively connected with the source area 512 and the drain area 513 through a contact hole formed in the interlayer insulating layer 12. A planarization layer 13 may be formed on the source electrode 53 and the drain electrode 54, and a pixel electrode 44 may be formed on the planarization layer 13. The pixel electrode 44 may be connected with the drain electrode 54 through a contact hole of the planarization layer 13.

A pixel definition layer 14 may be formed on the pixel electrode 44 and the planarization layer 13. The pixel definition layer 14 may partially expose the pixel electrode 44 by forming an opening 141 in each pixel. An organic emission layer 45 may be formed on the exposed pixel electrode 44, and the common electrode 42 may be formed in the entire area of the display unit 40 to cover the organic emission layer 45 and the pixel definition layer 14. The pixel electrode 44, the organic emission layer 45, and the common electrode 42 form the organic light emitting element 43.

The pixel electrode 44 may be a hole injection electrode and the common electrode 42 may be an electron injection electrode. In this case, the organic emission layer 45 may be formed of a hole injection layer (HIL), a hole transport layer (HTL), an emission layer, an electron transport layer (ETL), and an electron injection layer (EIL) that are sequentially stacked from the pixel electrode 44. Holes and electrons are injected to the organic emission layer 45 from the pixel electrode 44 and the common electrode 42, and emission of light from the organic emission layer 720 is made when the excitons being the combinations of the injected holes and electrodes drop from the excited state to the ground state.

The pixel electrode 44 may be formed as a transflective conductive layer and the common electrode 42 may be formed as a reflective conductive layer. Light emitted from the organic emission layer 45 is reflected by the common electrode 42 and then emitted to the outside through the substrate 10. Such a light emission structure is called a rear light emission type. The pixel electrode 44 may be formed of a triple-layered film of ITO/silver (Ag)/ITO, and the common electrode 42 may include one of silver (Ag), aluminum (Al), a silver alloy, and an aluminum alloy.

The first common power line 411 and the second common power line 412 may be formed on the same layer of one of the gate electrode 52, the source electrode 53, and the drain electrode 54. FIG. 5 illustrates that the first common power line 411 is formed on the same layer of the source and drain electrodes 53 and 54 with the same material, and FIG. 6 illustrates that the second common power line 412 is formed on the same layer of the gate electrode 52 with the same material.

Referring to FIG. 5 and FIG. 6, end portions of the first common power line 411 and the second common power line 412 may be extended to the wire and sealing area A20 at the peripherally outward side of the display unit 40. In addition, at least one insulating layer among four insulating layers formed in the display unit 40 may be extended to the wire and sealing area A20. The end portion of the first common power line 411 may be covered by the planarization layer 13, and the end portion of the second common power line 412 may be covered by the interlayer insulating layer 12 and the planarization layer 13.

The planarization layer 13 may include a second opening 131 to expose the end portion of the first common power line 411, and a first pad conductive layer 151 may be formed on the planarization layer 13 and electrically connected with the first common power line 411 through the second opening 131. The first pad 35 disposed in the long side of the substrate 10 may be referred to herein as the first pad conductive layer 151.

The interlayer insulating layer 12 and planarization layer 13 may include a third opening 16 to expose an end portion of the second common power line 412, and a second pad conductive layer 152 may be formed on the planarization layer 13 and electrically connected with the second common power line 412 through the third opening 16. The first pad 35 disposed at the short side of the substrate 10 may be referred to herein as the second pad conductive layer 152.

The first pad conductive layer 151 and second pad conductive layer 152 may be formed on the same layer of the pixel electrode 44 with same material. Then, an additional patterning process for forming the first and second pad conductive layers 151 and 152 can be omitted, and therefore the manufacturing process can be simplified.

Referring to FIG. 7, the common electrode 42 may be disposed peripherally inward from the first adhering layer 31 and the second pad 36 may be disposed to extend from a peripherally inward side to a peripherally outward side of the first adhering layer 31 such that the common electrode 42 and the conductive adhering layer 33 are in electrical contact with each other.

The second pad 36 may include a third pad conductive layer 153, a fourth pad conductive layer 154, and a fifth pad conductive layer 155. The third pad conductive layer 153 may be disposed peripherally inward from the first adhering layer 31, and may contact the common electrode 42. The fourth pad conductive layer 154 may be connected to the third pad conductive layer 153 through the fourth opening 132 of the planarization layer 13, and may extend from a peripherally inward side to a peripherally outward side of the first adhering layer 31. The fifth pad conductive layer 155 may be disposed between the conductive adhering layer 33 and the planarization layer 13, and may be connected with the fourth pad conductive layer 154 through a fifth opening 133.

The third pad conductive layer 153 and the fifth pad conductive layer 155 may be formed on the same layer as the pixel electrode 44 with the same material. In addition, the fourth pad conductive layer 154 may be formed on the same layer as one of the gate electrode 52 and the source and drain electrodes 53 and 54 with the same material. Thus, an additional patterning process for forming the second pad 36 can be omitted, and therefore the manufacturing process can be simplified.

FIG. 7 exemplarily illustrates that the fourth pad conductive layer 154 may be formed on the same layer as the source and drain electrodes 53 and 54. The detailed structure of the second pad 36 is not limited to the illustrated example, and any structure that places the common electrode 42 and the wire and sealing area A20 of the display unit 40 into electrical contact with each other may be used.

In the previously stated OLED display 100, the substrate 10 may be made of transparent glass or transparent plastic. The substrate 10 made of a transparent plastic material may include at least one of polyether sulfone, polyacrylate, polyether imide, polyethylene naphthalate, polyethylene terephthalate, poly phenylene sulfide, polyarylate, polyimide, polycarbonate, cellulose triacetate, and cellulose acetate propionate.

A plurality of processes for forming a plurality of pixels on the substrate 10 may be performed and heat may be applied to the substrate 10 during the processes such that the substrate 10 may expand due to the heat. Expansion of the substrate 10 may reduce durability of the OLED display 100 and density of the display unit 40 and therefore a material having a low thermal expansion coefficient is desirable for the substrate 10. The substrate 10 made of glass or plastic has a thermal expansion coefficient approximately between $3 \times 10^{-6}$/K to $4 \times 10^{-6}$/K.

Figure 8:
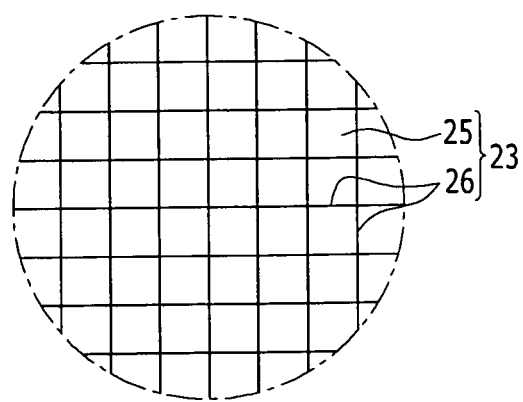
FIG. 8 illustrates a partially enlarged top plan view of a composite member of the OLED display of FIG. 1.

FIG. 8 illustrates a partially enlarged top plan view of the composite member of the OLED display of FIG. 1.

Referring to FIG. 8, the composite member 23 may be made of a carbon composite material including a plurality of carbon fibers 26 and resin 25. The composite member 23 may have a structure in which the carbon fibers 26 are impregnated with the resin 25. In other words, the resin 25 serves as a base layer that surrounds the carbon fibers 26 to fix them as one layer.

The carbon fibers 26 may have a lower thermal expansion coefficient than the substrate 10. Particularly, the thermal expansion coefficient in the length direction of the carbon fibers 26 may have a negative (−) value. On the other hand, the resin 25 may have a higher thermal expansion coefficient than the substrate 10. Thus, the thermal expansion coefficient of the composite member 23 can be controlled by controlling the amount of carbon fibers 26 and the amount of the resin 25.

When manufacturing the composite member 23 by compounding the carbon fibers 26 and the resin 25, the thermal expansion coefficient of the composite member 23 may be controlled to be equivalent or similar to that of the substrate 10 by controlling a ratio of the resin 25 and the carbon fibers 26.

The carbon fibers 26 do not absorb moisture so that they may increase the waterproofing ability of the composite member 23. In addition, the composite member 23 including the carbon fibers 26 has excellent mechanical properties so that high mechanical strength may be realized with a small thickness. Thus, the entire thickness of the OLED 100 can be reduced. In addition, the composite member 23 may function to suppress thermal expansion of the first inner layer 111 and the second inner layer 121.

The plurality of carbon fibers 26 may be arranged to cross each other, and, for example, may be woven with wefts and warps. Although FIG. 8 shows carbon fibers 26 that perpendicularly cross each other, the present embodiments are not limited to the example shown in FIG. 8 and the carbon fibers 26 may cross each other at predetermined angles other than the right angle. According to the configuration described above, the composite member 23 may have a low thermal expansion coefficient throughout the region and the durability of the composite member 23 may be increased.

Figure 9:
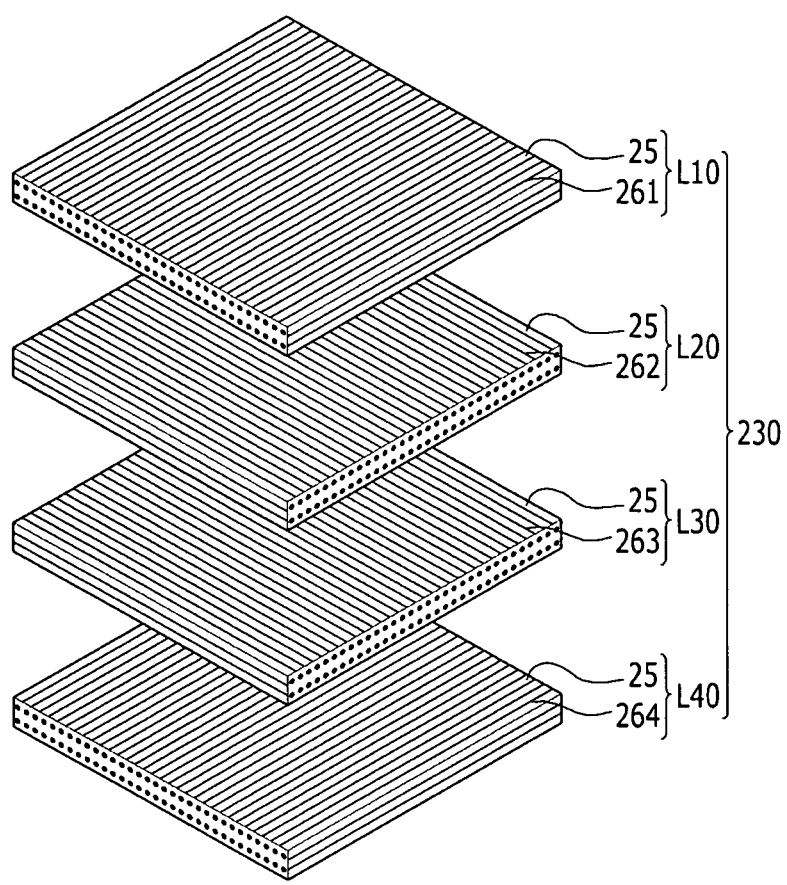
FIG. 9 relates to an exemplary variation of FIG. 8, illustrating an exploded perspective view of the composite member of the OLED display of FIG. 1.

As an exemplary variation, FIG. 9 illustrates an exploded perspective view of the composite member of the OLED display of FIG. 1.

Referring to FIG. 9, the composite member 230 may be formed of a plurality of layers. For example, the composite member 230 may have a structure formed by stacking the first layer L10, a second layer L20, a third layer L30, and a fourth layer L40. Each of the layers L10, L20, L30, and L40 may include a resin 25 and a plurality of carbon fibers 261, 262, 263, and 264.

The carbon fibers 261 and 264 of the first layer L10 and the fourth layer L40 may be arranged along a first direction, and the carbon fibers 262 and 263 of the second and third layers L20 and L30 may be arranged along a second direction. The first direction and the second direction may or may not perpendicularly cross each other. FIG. 9 exemplarily illustrates that the first direction and the second direction perpendicularly cross each other.

The resin 25 may be integrally hardened by pressure-baking such that the first to fourth layers L10 to L40 form a single composite member 230. When the plurality of carbon fibers 261, 262, 263, and 264 are arranged as described above, torsion of the composite member 230 may be suppressed so that planarity of the composite member 230 can be increased.

In order to control the thermal expansion coefficient, an angle formed by an arrangement direction of the carbon fibers 261 and 262 in the first and fourth layers L10 and L40 and an arrangement direction of the carbon fibers 262 and 263 of in the second and third layers L20 and L30 may be variously set. The thermal expansion coefficient of each of the respective layers L10, L20, L30, and L40 can be easily controlled by controlling the amount of the resin 25 and the carbon fibers 261, 262, 263, and 264 included in the respective layers L10, L20, L30, and L40.

The OLED display 100 of the first exemplary embodiment includes the first conductive portion 110 and the second conductive portion 120 in the sealing substrate 20 to apply the corresponding electric signal to the common power line 41 and the common electrode 42. In this case, since the sealing substrate 20 has a structure that includes both the composite member 23 and the insulating member 24 instead of only the composite member 23, an insulating film forming process for insulation between the first conductive portion 110 and the second conductive portion 120 can be omitted.

In addition, since it is not easy to form holes in the composite member 23 including solid carbon fibers 26, the sealing substrate 20 can be easily manufactured by forming the first through holes 21, which may be more numerous than the second through holes 22, in the insulating member 24. The first through holes 21 may be formed together when the insulating member 24 is formed by injection-molding plastic, or the holes of the insulating member 24 may be easily formed after the insulating member 24 is formed.

Figure 10:
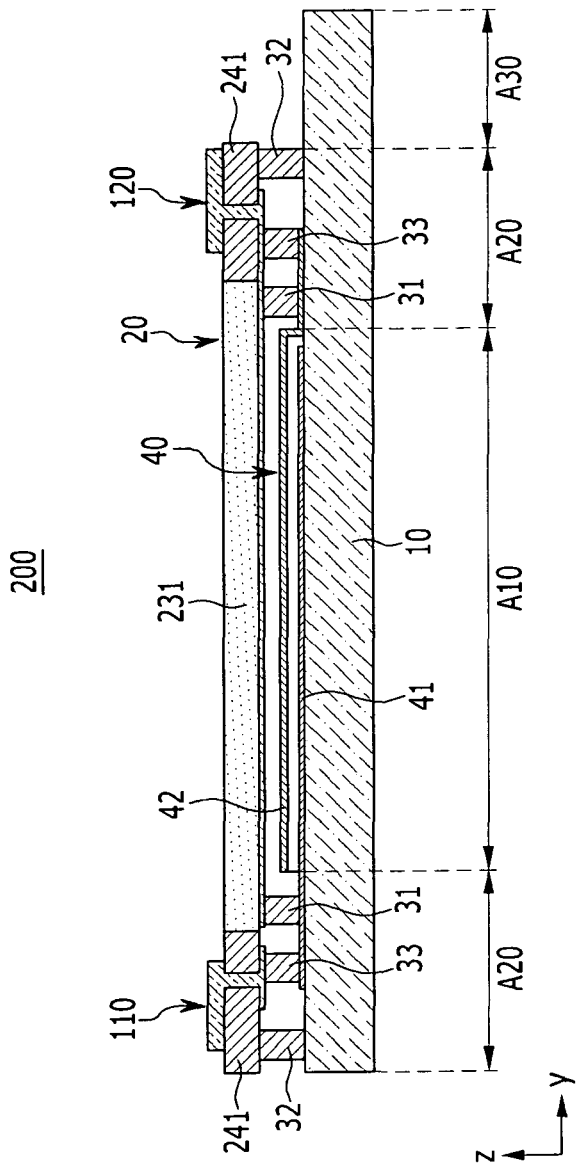
FIG. 10 illustrates a schematic cross-sectional view of an OLED display according to another exemplary embodiment.
Figure 11:
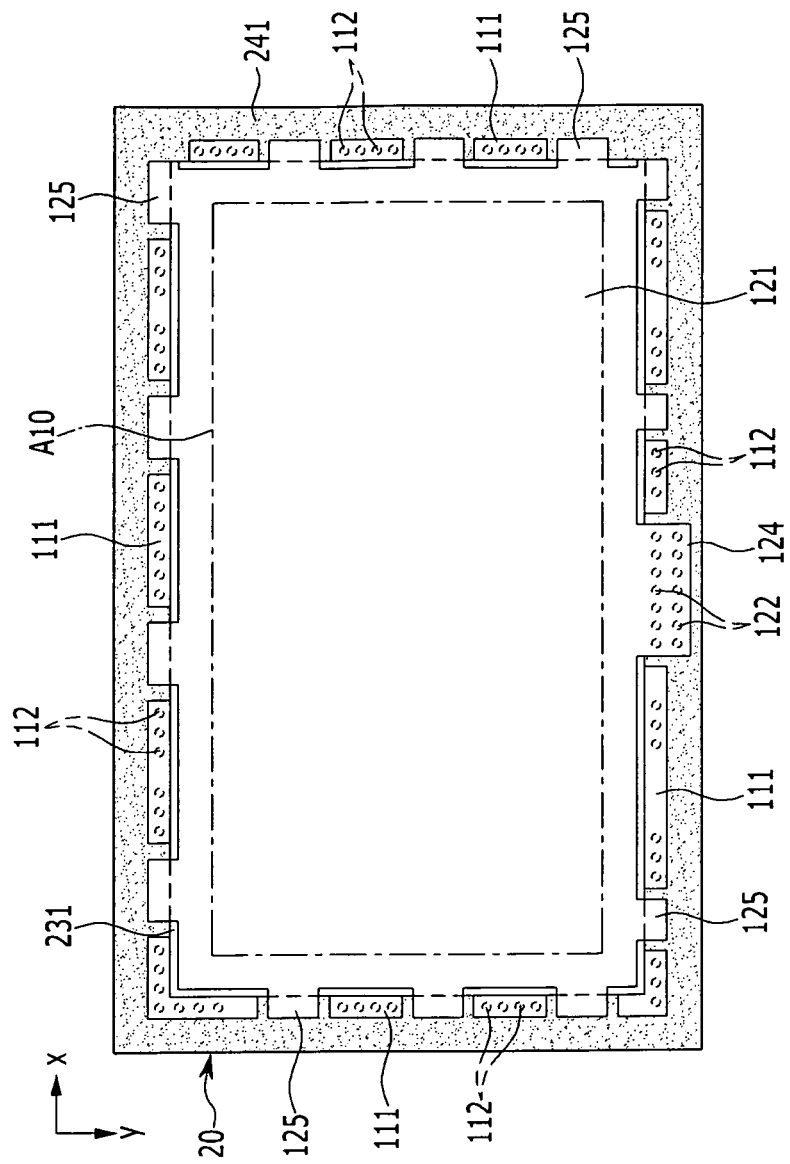
FIG. 11 illustrates a top plan view of an inner surface of a sealing substrate of the OLED display of FIG. 10.
Figure 12:
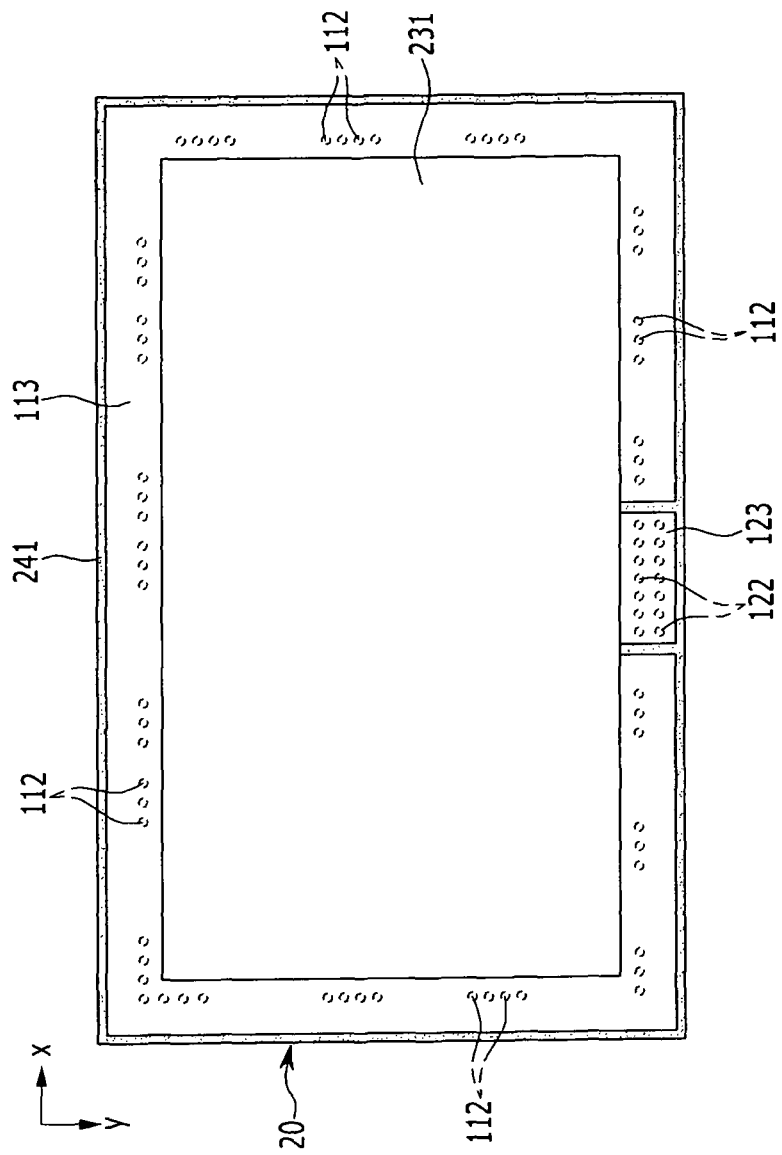
FIG. 12 illustrates a top plan view of an outer surface of the sealing substrate of the OLED display FIG. 10.

FIG. 10 illustrates a schematic cross-sectional view of an OLED display according to a another exemplary embodiment, and FIG. 11 and FIG. 12 illustrate plan views of the inner and outer sides, respectively, of a sealing substrate of the OLED display of FIG. 10.

Referring to FIG. 10 to FIG. 12, an OLED display 200 according to the exemplary embodiment of FIG. 10 may have the same structure as the exemplary embodiment of FIG. 1, except that an insulating member 241 is affixed to surround the entire side surface of a composite member 231 and first and second through holes 21 and 22 are formed in the insulating member 241. Like reference numerals designate like elements of the exemplary embodiment of FIG. 1.

A second inner layer 121 of a second conductive portion 120 may include a first extension portion 124 that extends in the inner side of the insulating member 241 to be in contact with a second connection portion 122 that extends through or fills the second through hole 22. In addition, the second inner layer 121 includes a second pad 36 formed in a substrate 10 and a plurality of second extension portions 125 that extend to the inner side of the insulating member 241. The second outer layer 123 is disposed at the outer side of the insulating member 241.

The first and second extension portions 124 and 125 are formed through the composite member 231 and the insulating member 241, but the first and second extension portions 124 and 125 are not short-circuited with a first conductive portion 110 because they are spaced apart from a first inner layer 111 on the insulating member 241.

When a second inner layer 121 is formed of a metal foil, the second inner layer 121 may be fixed to the composite member 231 after forming an oxide film by anodizing at one side of the second inner layer 121, facing the composite member 231. In this case, since the oxide film functions as an insulator, the second inner layer 121 is insulated from the composite member 231 and may be rigidly adhered to the composite member 231 by roughness of the oxide film.

Figure 13:
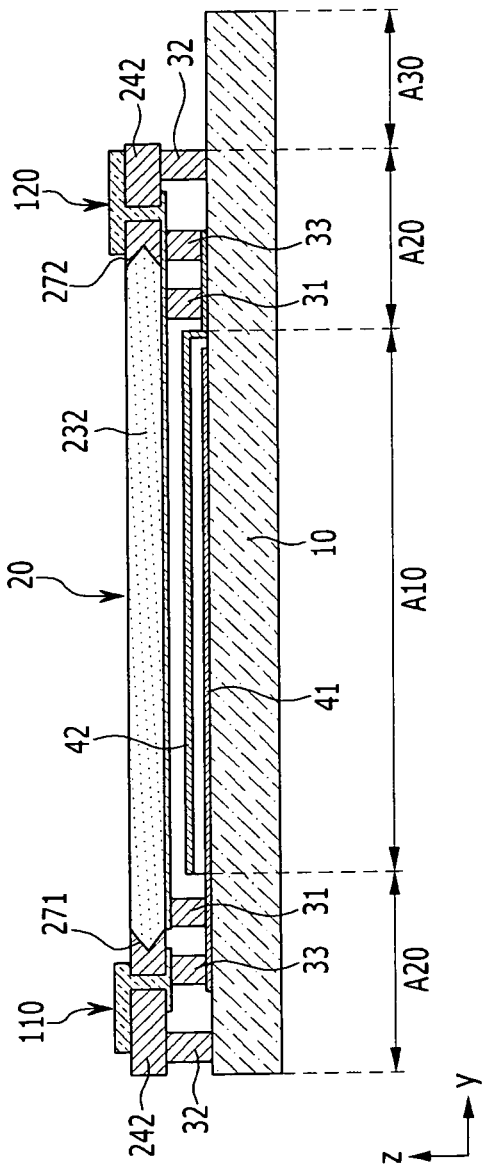
FIG. 13 illustrates a schematic cross-sectional view of an OLED display according to another exemplary embodiment.

FIG. 13 illustrates a schematic cross-sectional view of an OLED display according to another exemplary embodiment.

Referring to FIG. 13, an OLED display 300 according to this exemplary embodiment may have the same overall structure as the previously described exemplary embodiments, except that a protrusion-groove combination structure is formed at a peripherally outward side surface of a composite member 232 and a peripherally inward side surface of an insulating member 242. FIG. 13 illustrates that the protrusion-groove combination structure may be formed in the structure of the exemplary embodiment, of FIG. 10 and like reference numerals designate like elements of the exemplary embodiment of FIG. 10.

A protrusion 271 formed in the shape of "v" may protrude toward an insulating member 242 at the peripherally outward side surface of the composite member 232, and a groove 272 may be formed facing the protrusion 272 at a peripherally inward surface of the insulating member 242 for receiving the protrusion 271. The protrusion 271 may be formed by grinding or cutting an edge of the composite member 232. The shape of the protrusion 271 and the shape of the groove 272 are not restrictive, and any protrusion-groove combination structure may be used.

A sealing substrate 20 may be manufactured through two steps. That is, the composite member 232 including the resin 25 and the carbon fibers 26 may be manufactured by hot-pressing the composite member 232 and then the composite member 232 may be inserted to an injection-mold. The insulating member 242 may be injection-molded by injecting a resin to the edge portion of the composite member 232 in the injection mold. Alternatively, the sealing substrate 20 may be manufactured by pressing the composite member 232 using an upper mold of the injection mold and injection-molding the insulating member 242 by injecting a resin to the edge portion of the composite member 232 in the injection mold.

A combination structure of a protrusion 271 and a groove 272 of the composite member 232 and the insulating member 242 may enable the insulating member 242 to be more effectively attached to the composite member 232, thereby increasing the bonding force of the composite member 232 and the insulating member 24. Thus, the composition member 232 and the insulating member 242 may not easily separate after the sealing substrate 20 is manufactured.

Figure 14:
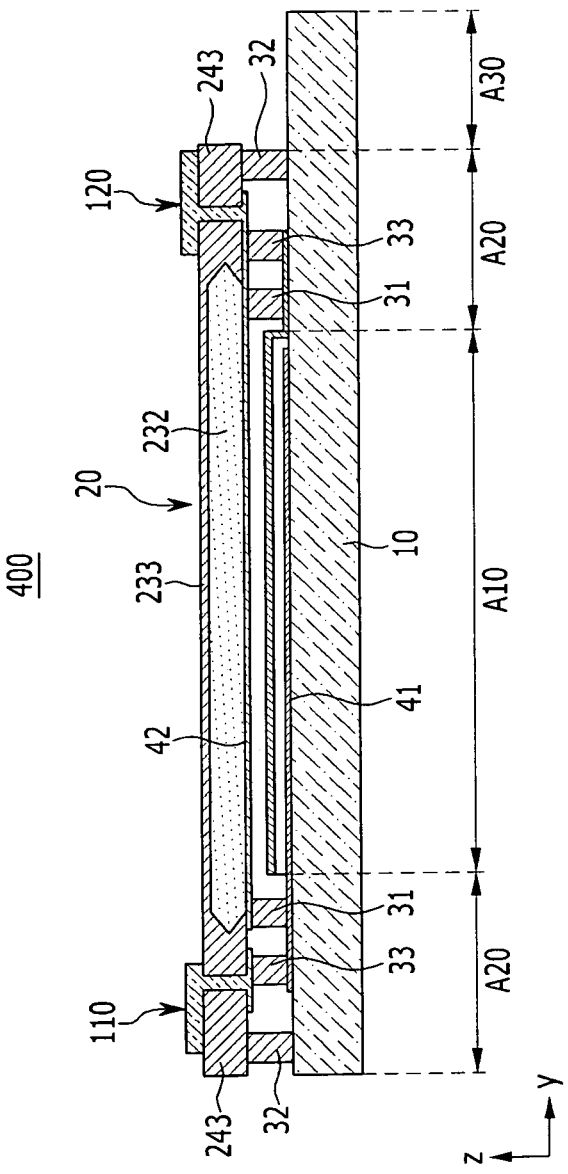
FIG. 14 illustrates a schematic cross-sectional view of an OLED display according to another exemplary embodiment.

FIG. 14 illustrates a schematic cross-sectional view of an OLED display according to another exemplary embodiment.

Referring to FIG. 14, an OLED display 400 according to the this exemplary embodiment may have the same overall structure as the previously described exemplary embodiments, except that an insulating plate 233 covering the outer side of a composite member 232 is further formed. FIG. 14 illustrates that an insulating plate 233 further formed in the structure of the exemplary embodiment of FIG. 13, and like reference numerals designate like elements of the exemplary embodiment of FIG. 13.

The insulating plate 233 may be integrally formed with an insulating member 243 when manufacturing the insulating member 243 by injection molding. The insulating plate 233 may be wholly attached to the outer surface of the composite member 232 to increase the bonding force between the insulating member 243 and the composite member 232 and may insulate the outer surface of the composite member 232. The insulating plate 233 may be thin in order not to increase the thermal expansion coefficient of a sealing substrate 20. For example, the thickness of the insulating plate 233 may be set to be less than 20% to 30% of the thickness of the composite member 232.

Figure 15:
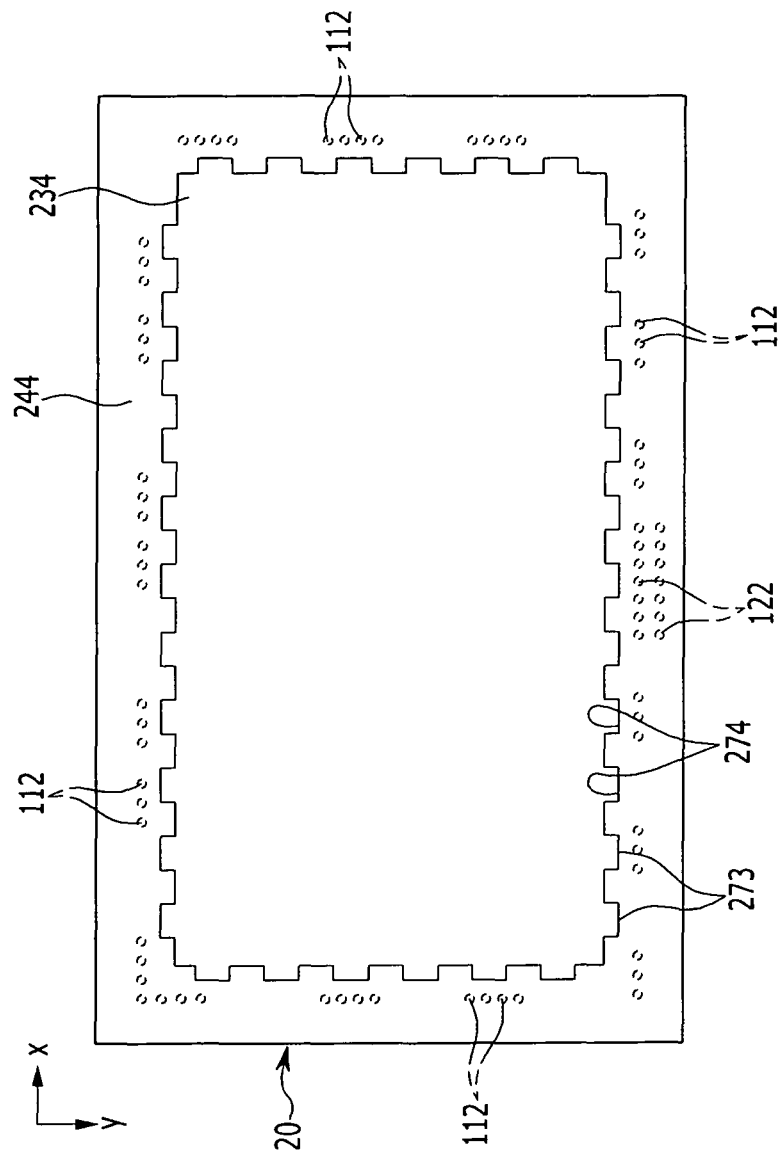
FIG. 15 illustrates a top plan view of an outer surface of a sealing substrate of an OLED display according to another exemplary embodiment.

FIG. 15 illustrates a top plan view illustrating an outer surface of a sealing substrate of an OLED display according to another exemplary embodiment.

Referring to FIG. 15, an OLED display 500 according to the this exemplary embodiment may have the same overall structure as the previously described exemplary embodiments, except that gear-teeth-shaped protruding portions 273 and recess portions 274 are formed along an edge of a composite member 234 at a peripherally outward side surface of the composite member 234 and an peripherally inward side surface of an insulating plate 244.

FIG. 15 illustrates that the protruding portion 273 and the recess portion 274 may be formed in the sealing substrate structure of the exemplary embodiment of FIG. 10, and illustration of first and second conductive portions 110 and 120 is omitted. Like reference numerals designate like elements of the exemplary embodiment of FIG. 10.

A plurality of protruding portions 273 may be formed along the edge of the composite member 234 at the peripherally outward side surface thereof, and the protruding portions 273 may be spaced apart from each other. In addition, a plurality of recess portions 274 that receive the protruding portions 273 may be formed at a peripherally inward surface of the insulating member 244, facing the plurality of protruding portions 273. The shape of the protruding portions 273 and the shape of the recess portions 274 are not restrictive. Any structure that can combine the protruding portion and the recess portion may be used.

The protruding portions 273 and the recess portions 274 enlarge a contact area of the composite member 234 and the insulating member 244 to increase the bonding force between the composite member 234 and the insulating member 244. Thus, the composite member 234 and the insulating member 244 may not easily separate after the sealing substrate 20 is manufactured.

Figure 16:
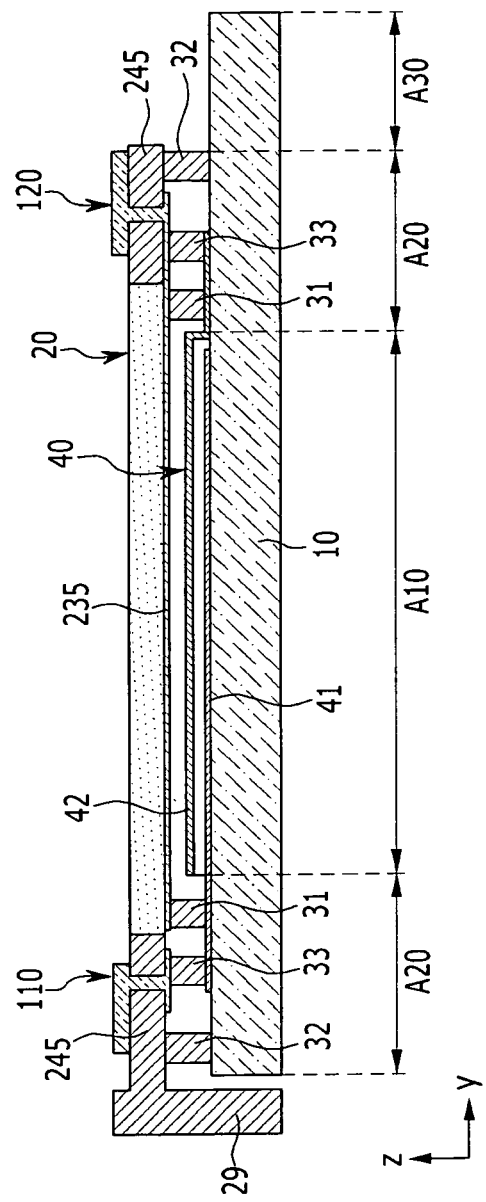
FIG. 16 illustrates a schematic cross-sectional view of an OLED display according to another exemplary embodiment.

FIG. 16 is a schematic cross-sectional view of an OLED display according to another exemplary embodiment.

Referring to FIG. 16, an OLED display 600 according to this exemplary embodiment may have the same overall structure as the previously described exemplary embodiments, except that a protection portion 29 is further formed to cover side surfaces of a second adhering layer 32 and a substrate 10 for protection. FIG. 16 illustrates that the protection portion 29 may be formed in the structure of the exemplary embodiment of FIG. 10, and like reference numerals designate like elements of the exemplary embodiment of FIG. 10.

The protection portion 29 may be integrally formed with an insulating member 245, and may be disposed perpendicularly to the insulating member 245. The protection portion 29 may be formed at three edges of the insulating member 245 that are not facing a pad area A30. The protection portion 29 may protect a substrate 10 made of a fragile material such as glass, and may function to increase the bending strength of a composite member 235. Such a protection portion 29 may be formed together with the insulating member 245 when manufacturing the insulating member by injection molding.

In the OLED displays 100 to 600 of the exemplary embodiments described herein, the insulating members 24, 241, 242, 243, 244, and 245 may be made of plastic that includes a negative thermal expansion filler.

Typical plastic has a high thermal expansion coefficient compared to a composite member 23 including a carbon fiber 26. When an insulating member 24 is made of the typical plastic, a stress may be generated between the integrally combined composite member 23 and the insulating member 24 if the peripheral temperature of the OLED display varies by a large difference, thereby causing deformation or separation.

Thus, the insulation members 24, 241, 242, 243, 244, and 245 may be made of plastic into which the negative thermal expansion filler is saturated so that a thermal expansion coefficient difference with the composite member 23 can be reduced. The negative thermal expansion filler may include at least one of tungsten zirconium ($ZrW_2O_8$), $AM_2O_8$ (where, A is Zr or Hf and M is Mo or W), $ZrV_2O_7$, and $A_2(MO_4)_3$ (where, A is Zr or Hf and M is Mo or W).

Figure 17:
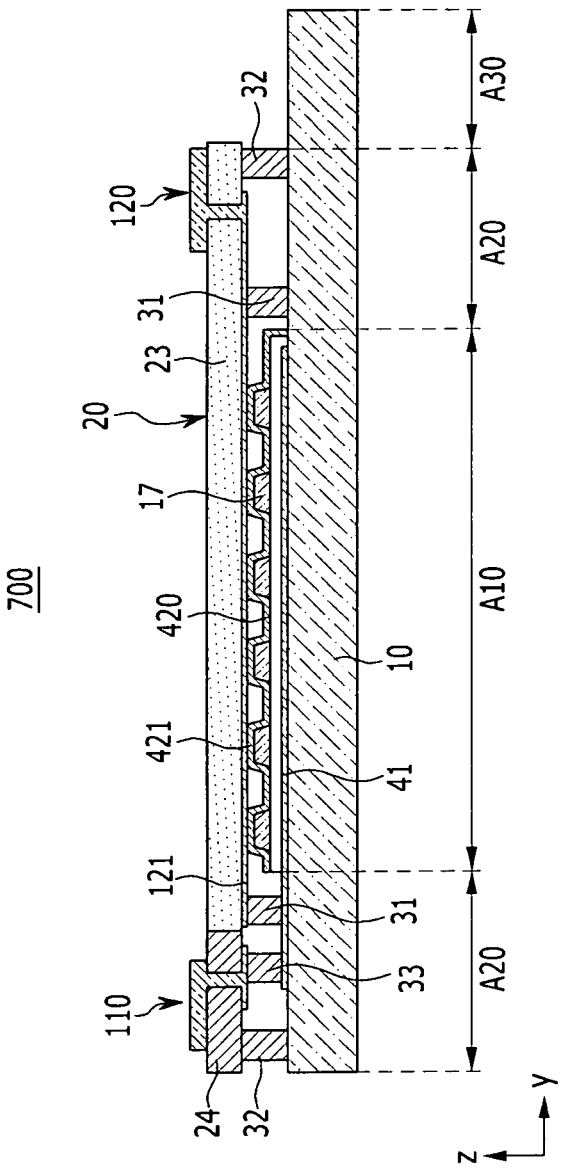
FIG. 17 illustrates a schematic cross-sectional view of an OLED display according to another exemplary embodiment.
Figure 18:
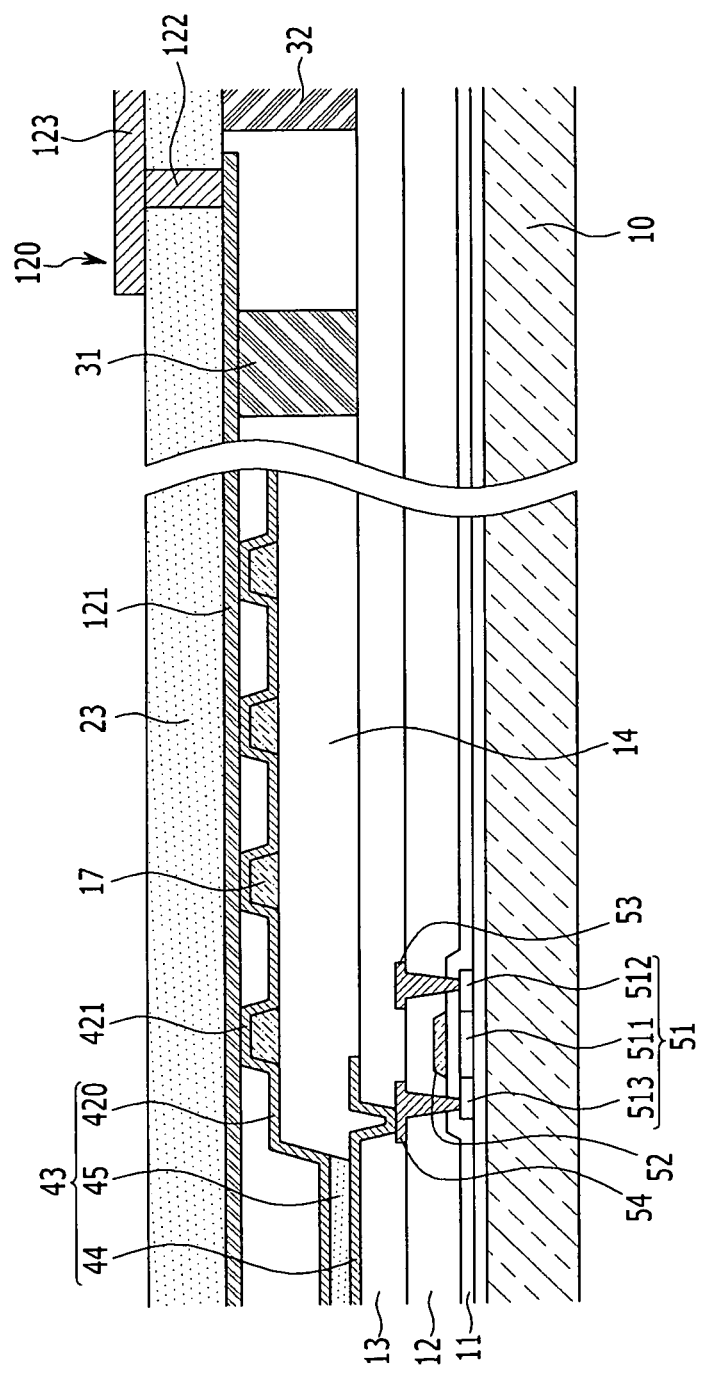
FIG. 18 illustrates a partially enlarged view of the OLED display of FIG. 17.

FIG. 17 is a schematic cross-sectional view of an OLED display according to another exemplary embodiment and FIG. 18 is a partially enlarged view of the OLED display of FIG. 17.

Referring to FIG. 17 and FIG. 18, an OLED display 700 according to the this exemplary embodiment may have the same overall structure as any one of the previously described exemplary embodiments, except that a second pad is omitted in the OLED display 700 and a second inner layer 121 formed in a sealing substrate 20 contacts a common electrode 420. The OLED display illustrated in FIG. 17 may be based on the OLED display of the exemplary embodiment of FIG. 1 as a basic structure, and like reference numerals designate like elements of the exemplary embodiments of FIGS. 1 and 10.

In a display unit 40, the common electrode 420 may form a protrusion and depression structure. The common electrode 420 may include plurality of protruding portions 421 that are sealed to the second inner layer 121 formed in the sealing substrate 20. The common electrode 420 may be directly connected with the second conductive portion 120 without passing through a conductive adhering layer 33 and may receive a second electric signal therefrom.

The protrusion and depression structure of the common electrode 420 can be formed by providing a spacer 17. For example, a plurality of spacers 17 may be formed on a pixel definition layer 14, and the common electrode 420 may be formed throughout the entire area of the display unit 40 while covering the plurality of spacers 17. The common electrode 420 may be sealed to the second inner layer 121 when sealing the substrate 10 and the sealing substrate 20 by pressing and may be electrically connected with the second conductive portion 120.

In the OLED display 700 of the exemplary embodiment of FIGS. 17 and 18, only the first pad 35 is disposed in a wire and sealing area A20 for applying a first electric signal of a common power line 41. In addition, a second inner layer formed in the sealing substrate with a plurality of second extension portions extended toward a second pad is not provided as in the exemplary embodiment of FIG. 1.

By way of summation and review, since a function of a display unit including a plurality of organic light emitting elements may deteriorate when the display unit is exposed to moisture and oxygen, a technique for sealing the display unit to suppress penetration of external moisture and oxygen is desired. The described technology has been made in an effort to provide a display device in which a sealing function of a display unit and an organic light emitting diode (OLED) display is improved. The OLED display according to the described embodiments may enhance the sealing function of the display unit, may increase luminance uniformity of the screen while providing a large-sized display unit, and may simplify an entire structure and manufacturing process by reducing the number of parts. In addition, the first conductive portion and the second conductive portion can be insulated from each other without providing an insulating means such as an insulating layer to the sealing substrate.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A display device, comprising:
   a display substrate;
   a display unit disposed on the display substrate;
   a sealing substrate affixed to the display substrate by an adhering layer located outside an outer periphery of the display unit, the sealing substrate located outside of a display area of the display substrate, the sealing substrate including a composite member including a resin and a plurality of carbon fibers and an insulating member affixed to the composite member, the insulating member including a plurality of first through holes through the insulating member;
   a metal film disposed at one side of the sealing substrate, facing the display substrate; and a conductive connection portion contacting the metal film through a plurality of second through holes through the sealing substrate;

wherein the insulating member is affixed to the composite member at a peripherally outward side of at least three peripheral edges of the composite member, and wherein the adhering layer includes a first non-conductive adhering layer located outside the outer periphery of the display unit, a second non-conductive adhering layer located peripherally outward from the first non-conductive adhering layer, and a conductive adhering layer between the first non-conductive adhering layer and the second non-conductive adhering layer.

2. The display device as claimed in claim 1, wherein the carbon fibers cross each other in the resin.

3. The display device as claimed in claim 1, wherein the composite member includes a plurality of layers, each of the plurality of layers including a resin and a plurality of carbon fibers, wherein a plurality of carbon fibers arranged in at least one of the plurality of layers and a plurality of carbon fibers arranged in at least another layer among the plurality of layers cross each other.

4. The display device as claimed in claim 1, further comprising:
a first conductive portion extending between inner and outer sides of the insulating member through the plurality of first through holes and receiving a first electric signal; and
a second conductive portion extending between inner and outer sides of the composite member through the plurality of second through holes and receiving a second electric signal.

5. The display device as claimed in claim 1, wherein the insulating member is affixed to the composite member at a peripherally outward side of all peripheral edges of the composite member.

6. The display device as claimed in claim 5, further comprising:
a first conductive portion extending between inner and outer sides of the insulating member through the plurality of first through holes and receiving a first electric signal; and
a second conductive portion extending between an inner side of the insulating member, an inner side of the composite member, and an outer side of the insulating member through the plurality of second through holes and receiving a second electric signal.

7. The display device as claimed in claim 1, wherein the composite member includes a protrusion at a side surface that faces the insulating member, and the insulating member includes a groove receiving the protrusion.

8. The display device as claimed in claim 1, wherein the composite member includes a plurality of protruding portions spaced apart from each other at a side surface facing the insulating member, and the insulating member includes a plurality of recess portions receiving the protruding portions.

9. The display device as claimed in claim 1, wherein the insulating member further includes an insulating plate covering an external surface of the composite member.

10. The display device of claim 1, wherein the insulating member further includes a protection portion that protectively covers the adhering layer and a side surface of the display substrate.

11. The display device as claimed in claim 1, wherein the insulating member is a plastic injection molded material.

12. The display device as claimed in claim 11, wherein the insulating member includes a negative thermal expansion filler.

13. The display device as claimed in claim 1, wherein the metal film includes at least one of an aluminum film, an aluminum alloy film, a copper film, and a copper alloy film.

14. An organic light emitting diode (OLED) display, comprising:
a display substrate;
a display unit disposed on the display substrate and including a common power line and a common electrode;
a sealing substrate affixed to the display substrate by at least one adhering layer located outside an outer periphery of the display unit, the sealing substrate located outside of a display area of the display substrate, the sealing substrate including first and second through holes through the sealing substrate;
a first conductive portion disposed on inner and outer sides of the sealing substrate and extending through the first through holes, the first conductive portion supplying a first electric signal to the common power line; and
a second conductive portion disposed on the inner and outer sides of the sealing substrate and extending through the second through holes, the second conductive portion supplying a second electric signal to the common electrode,
wherein the sealing substrate includes,
a composite member including a resin and a plurality of carbon fibers, and
an insulating member attached to the composite member and including at least one through hole among the first and second through holes;
wherein the insulating member is attached to the composite member at peripherally outward sides of at least three peripheral edges of the composite member, and wherein the insulating member includes the first through holes, and the composite member includes the second through holes, and
wherein the at least one adhering layer includes a first non-conductive adhering layer located outside the outer periphery of the display unit, a second non-conductive adhering layer located peripherally outward from the first non-conductive adhering layer, and a conductive adhering layer between the first non-conductive adhering layer and the second non-conductive adhering layer.

15. The OLED display as claimed in claim 14, further comprising:
a pad unit disposed peripherally outward from the display unit, and including a first pad connected with the common power line and a second pad connected with the common electrode; and
the conductive adhering layer is disposed between the first pad and the first conductive portion and between the second pad and the second conductive portion.

16. The OLED display as claimed in claim 15, wherein the common power line includes a first common power line and a second common power line that cross each other, and wherein the pad unit includes a plurality of the first pad and the second pad iteratively alternated along one direction of the display substrate.

17. The OLED display as claimed in claim 15, wherein the conductive adhering layer is electrically conductive in the thickness direction and electrically insulating in directions other than the thickness direction.

18. The OLED display as claimed in claim 14, further comprising a first pad disposed at an outer side of the display unit and the conductive adhering layer is disposed between the first pad and the first conductive portion, and wherein the second conductive portion is directly attached to the common electrode.

19. The OLED display as claimed in claim 18, further comprising a plurality of spacers disposed at a lower portion of the common electrode,
wherein the common electrode includes protruding portions corresponding to the spacers and contacting the second conductive portion.

20. The OLED display as claimed in claim 14, wherein the first conductive portion includes a first inner layer disposed at the inner side of the insulating member, a first connection portion extending through the first through hole, and a first outer layer disposed at the outer side of the insulating member, and wherein the second conductive portion includes a second inner layer formed at the inner side of the composite member, a second connection portion filled in the second through hole, and a second outer layer formed at the outer side of the composite member.

21. The OLED display as claimed in claim 14, wherein the insulating member is attached to the composite member at a peripherally outward side of the edges of the composite member, and wherein the insulating member includes the first and second through holes.

22. The OLED display as claimed in claim 21, wherein the first conductive portion includes a first inner layer at the inner side of the insulating member, a first connection portion that fills the first through hole, and a first outer layer at the outer side of the insulating member, and the second conductive portion includes a second inner layer at the inner side of the insulating member and the inner side of the composite member, a second connection portion that fills the second through hole, and a second outer layer at the outer side of the insulating member.

23. The OLED display as claimed in claim 22, wherein the second inner layer includes a metal foil having an oxide film formed by anodizing at one side thereof, facing the composite member.

24. The OLED display as claimed in claim 14, wherein the insulating member is made of a plastic injection molded material.

25. The OLED display as claimed in claim 24, wherein the insulating member includes a negative thermal expansion filler.

26. The OLED display as claimed in claim 24, wherein the composite member includes a protrusion at a side surface thereof, facing the insulating member, and the insulating member includes a groove that receives the protrusion.

27. The OLED display as claimed in claim 24, wherein the composite member includes a plurality of protruding portions spaced apart from each other at a side surface, facing the insulating member and the insulating member includes recess portions receiving the protruding portions.

28. The OLED display as claimed in claim 24, wherein the insulating member further includes an insulating plate covering an external surface of the composite member.

29. The OLED display as claimed in claim 24, wherein the insulating member further includes a protection portion covering the adhering layer and the display substrate along the thickness direction.

* * * * *